US012740183B2

(12) United States Patent
Wang et al.

(10) Patent No.: US 12,740,183 B2
(45) Date of Patent: Sep. 15, 2026

(54) INFRARED DETECTOR WITH PHOTONIC CRYSTAL OVER ABSORPTION LAYER AND PREPARATION METHOD THEREFOR

(71) Applicant: Shanghai Institute of Technical Physics, CAS, Shanghai (CN)

(72) Inventors: Fang Wang, Shanghai (CN); Weida Hu, Shanghai (CN); Haonan Ge, Shanghai (CN); Runzhang Xie, Shanghai (CN); Fuxing Dai, Shanghai (CN); Ruiqi Jiang, Shanghai (CN)

(73) Assignee: Shanghai Institute of Technical Physics, CAS, Shanghai (CN)

(*) Notice: Subject to any disclaimer, the term of this patent is extended or adjusted under 35 U.S.C. 154(b) by 414 days.

(21) Appl. No.: 18/479,429

(22) Filed: Oct. 2, 2023

(65) Prior Publication Data

US 2024/0429330 A1 Dec. 26, 2024

(30) Foreign Application Priority Data

Jun. 20, 2023 (CN) ......................... 202310736479.4

(51) Int. Cl.

*H01L 31/0236* (2006.01)
*H01L 31/0216* (2014.01)
*H01L 31/0304* (2006.01)
*H01L 31/09* (2006.01)
*H01L 31/18* (2006.01)

(Continued)

(52) U.S. Cl.

CPC ........... *H10F 77/703* (2025.01); *H10F 30/10* (2025.01); *H10F 71/127* (2025.01); *H10F 77/124* (2025.01); *H10F 77/334* (2025.01)

(58) Field of Classification Search

CPC ..................................................... H10F 77/703

See application file for complete search history.

(56) References Cited

U.S. PATENT DOCUMENTS

| | | | | |
|---|---|---|---|---|
| 2007/0001183 | A1* | 1/2007 | Chen | H10H 20/814 257/E33.068 |
| 2021/0091252 | A1* | 3/2021 | Atabaki | H10F 77/14 |
| 2022/0384666 | A1* | 12/2022 | Joe | H10F 77/337 |

FOREIGN PATENT DOCUMENTS

| | | | | |
|---|---|---|---|---|
| CN | 106024931 A | * 10/2016 | ......... | H10F 71/1272 |
| WO | WO-2012053491 A1 | * 4/2012 | ........... | G06F 3/0412 |

OTHER PUBLICATIONS

Notes on photonic topological insulators and scattering-protected edge states—a brief introduction. arXiv:1602.02425v4 (2016).*

(Continued)

*Primary Examiner* — Peter Bradford
(74) *Attorney, Agent, or Firm* — BEKIARES ELIEZER LLP

(57) ABSTRACT

A short-wave infrared detector unit device and a preparation method therefor are provided, which belongs to the technical field of infrared detectors. A photonic crystal structure layer with multi-coupled topological defects is arranged on a surface of an absorption layer. The photonic crystal structure layer with multi-coupled topological defects is a third dielectric material layer with a through-hole structure. The third dielectric material layer is provided with first through holes in periodic arrangement and second through holes in periodic arrangement. The first through holes are filled with a first dielectric material, and the second through holes are filled with a second dielectric material.

6 Claims, 6 Drawing Sheets

(51) Int. Cl.

| | |
|---|---|
| ***H10F 30/10*** | (2025.01) |
| ***H10F 71/00*** | (2025.01) |
| ***H10F 77/124*** | (2025.01) |
| ***H10F 77/30*** | (2025.01) |
| ***H10F 77/70*** | (2025.01) |

(56) References Cited

OTHER PUBLICATIONS

Hanson el al, "Notes on photonic topological insulators and scattering-protected edge states—a brief introduction", arXiv: 1602.02425v4 [cond-mat.mes-hall] Dec. 13, 2016.*

* cited by examiner a
Coupling strength
140
120
100
80
60
40
20
0
La=0.7 μm
Da=0.4 μm
Da=0.5 μm
Da=0.6 μm
0.1
0.2
0.3
0.4
0.5
Db ( μm )

INFRARED DETECTOR WITH PHOTONIC CRYSTAL OVER ABSORPTION LAYER AND PREPARATION METHOD THEREFOR

CROSS-REFERENCE TO RELATED APPLICATION

This patent application claims the benefit and priority of Chinese Patent Application No. 2023107364794 filed with the China National Intellectual Property Administration on Jun. 20, 2023, the disclosure of which is incorporated by reference herein in its entirety as part of the present application.

TECHNICAL FIELD

The present disclosure belongs to the technical field of infrared detectors, and in particular to a short-wave infrared detector unit device and a preparation method therefor.

BACKGROUND

Infrared detectors are widely used in missile guidance, atmospheric monitoring, night investigation and other fields. In the general infrared detectors, InAs/GaSb Superlattice materials are grown on a thick GaSb substrate by molecular beam epitaxy (MBE), and then the substrate is removed, and infrared light passing through the substrate is absorbed by an absorption region of the detector material. At present, the new generation of the infrared detectors are developing towards smaller size, lighter weight, lower power consumption, higher performance and lower price, that is, SWaP3 index.

In recent years, with the development of micro-nano machining technology and micro-nano optics theory, the ability of artificial micro-nano structures designed based on physical mechanisms, such as photonic crystals, to regulate light field has aroused widespread interest and research, and the idea of enhancing the performance of the infrared detectors through the artificial micro-nano structures has also been proposed accordingly. The local mode excited by the interaction of the artificial micro-nano structures and photons can localize the incident light at a sub-wavelength scale, which can improve the general problem of low quantum efficiency caused by the short propagation distance of light in the material due to thin absorption layer in the infrared detectors or improve the light collection efficiency of the infrared detectors with small photosensitive area. The miniaturization and integration of the detectors are realized, and thus the size, weight and power consumption of the infrared detectors are reduced.

However, due to the time reversal symmetry of traditional photonic crystals, it is difficult for external light sources to excite the local modes in the photonic crystals. Therefore, how to effectively combine the micro-nano machining with the photonic crystals to enhance the localization of the incident light field by the photonic crystal structure so as to enhance an infrared signal of a focal plane pixel of the infrared detector, is still the bottleneck for the development of the infrared detectors towards the SWaP3 index.

SUMMARY

The present disclosure intends to provide a short-wave infrared detector unit device and a preparation method therefor. The short-wave infrared detector unit device provided by the present disclosure enhances the localization of an incident light field, thereby achieving the enhancement of an infrared signal of a focal plane pixel of the infrared detector.

In order to achieve the above effects, the present disclosure provides the following solutions:

A short-wave infrared detector unit device includes a substrate, and an epitaxial layer arranged on a surface of the substrate. An outermost layer of the epitaxial layer is an absorption layer 9. The short-wave infrared detector unit device further includes a photonic crystal structure layer with multi-coupled topological defects arranged on a surface of the absorption layer 9, the photonic crystal structure layer with multi-coupled topological defects is a third dielectric material layer 3 with a through-hole structure, and the third dielectric material layer 3 has a refractive index of $n_3$. The through-hole structure includes first through holes 1 in periodic arrangement and second through holes 2 in periodic arrangement. Each of the first through holes 1 is filled with a first dielectric material, and the first dielectric material has a refractive index of $n_1$. Each of the second through holes 2 is filled with a second dielectric material, and the second dielectric material has a refractive index of $n_2$. Where $n_1$ is less than $n_3$, and $n_2$ is less than $n_3$.

A periodic arrangement rule of the first through holes 1 is that: a center of any of the first through holes 1 is taken as a center of a first regular hexagon, a side length of the first regular hexagon is La, and six vertexes of the first regular hexagon correspond to centers of the other six first through holes 1, respectively.

A periodic arrangement rule of the second through holes 2 is that: the third dielectric material layer 3 is divided into multiple rectangular regions with a center of one of the first through holes 1 as a center of one of the multiple rectangular regions, a length×width of each of the multiple rectangular regions is 8 La×6.92 La, The multiple rectangular regions do not overlap each other, the center of each of the multiple rectangular regions is taken as a center of a second regular hexagon, a side length of the second regular hexagon is 2 La, and six vertexes of the second regular hexagon correspond to centers of the second through holes 2.

In an embodiment, the absorption layer 9 is made of InAs, and a thickness h of the absorption layer is 0.1 μm. An infrared absorption wavelength of the short-wave infrared detector unit device is 1.55 μm.

In an embodiment, a thickness H of the photonic crystal structure layer with multi-coupled topological defects is 100 nm.

In an embodiment, La is from 0.7 μm to 0.9 μm.

In an embodiment, $n_3$ is from 3 to 5, $n_1$ is from 1 to 2, and $n_2$ is from 1 to 2.29.

In an embodiment, a diameter Da of each of the first through holes 1 is from 0.2 μm to 0.8 μm, and a diameter Db of each of the second through holes 2 is from 0.1 μm to 0.8 μm.

In an embodiment, $n_1$ is 1.46, $n_2$ is 1.7, $n_3$ is 4.0, La is 0.8 μm, a diameter Da of each of the first through holes 1 is 0.6 μm, and the diameter Db of each of the second through holes 2 is 0.2 μm.

In an embodiment, $n_3$ is 4.0, $n_2$ is 1.7, $n_1$ is 1.46, La is 0.7 μm, the diameter Da of each of the first through holes 1 is 0.5 μm, and the diameter Db of each of the second through holes 2 is 0.2 μm.

In an embodiment, $n_3$ is 3.47, $n_2$ is 2.29, $n_1$ is 1.46, La is 0.8 μm, the diameter Da of each of the first through holes 1 is 0.6 μm, and the diameter Db of each of the second through holes 2 is 0.4 μm. The third dielectric material layer 3 is made of a silicon material, the second dielectric material is a zinc sulfide material, and the first dielectric material is an amorphous silicon dioxide material.

A preparation method for the short-wave infrared detector unit device according to the above technical schemes includes the following steps:

- depositing a third dielectric material on a surface of an absorption layer to form a third dielectric material layer 3;
- etching first through holes 1 on the third dielectric material layer 3 according to a periodic arrangement rule of the first through holes 1, and filling each of the first through holes 1 with a first dielectric material;
- etching second through holes 2 on the third dielectric material layer 3 having the first through holes 1 according to an arrangement rule of the second through holes 2, and filling each of the second through holes 2 with a second dielectric material, to obtain the short-wave infrared detector unit device.

According to the present disclosure, the epitaxial layer with the absorption layer is formed by arranging the third dielectric material on the surface of the absorption layer. Then, a cellular shaped first through-hole structure in orderly arrangement is formed in the third dielectric material layer. The first through-hole structure is filled with the first dielectric material. A photonic crystal structure array layer is formed by arranging the cellular-shaped first dielectric material in the third dielectric material. A periodic change of the refractive index in the photonic crystal structure can periodically modulate an incident light field, which makes light generate Bragg scattering, so as to change a propagation direction of a vertical incident light field. The destructive interference by multiple reflections of the light propagating in the photonic crystal at interfaces of different refractive index regions formed by the third dielectric material and the first dielectric material can prevent a propagation of an electromagnetic wave with a specific wavelength, so as to localize the electromagnetic field in the photonic crystal structure, i.e., a photonic band gap. In the present disclosure, by utilizing the characteristic that the electromagnetic wave within the photonic band gap in the photonic crystal structure cannot be transmitted to cause the light field to be localized, the absorption of infrared light by the infrared detector is effectively enhanced. In another aspect, the second through holes are further formed in the photonic crystal structure layer, and are filled with the second dielectric material. Topological defects are formed in the photonic crystal structure layer through the second dielectric material in the second through holes, including defect bands and defect modes, so as to destroy the periodicity of a photonic crystal structure distribution. The defect modes (the design point defect of the present disclosure) make the dielectric constant of the photonic crystal structure layer discontinuous, such that the incident light is reflected, scattered and diffracted in the photonic crystal structure layer, and oscillates back and forth in a small region, and thus gathering electromagnetic field energy in a micro-cavity in a micron-scale region. While the defect band (the design line defect of the present disclosure) makes the light wave in a certain band gap begin to propagate. Therefore, in the present disclosure, the localization of the incident light field by the photonic crystal structure is enhanced through the coupling between the two topological defects of the defect band and the defect mode and the interference of a leaky mode (i.e., the photonic band gap), enhancing an infrared signal of the focal plane pixel of the infrared detector.

BRIEF DESCRIPTION OF THE DRAWINGS

In FIG. 1 and FIG. 2, 1 denotes a first through hole, 2 denotes a second through hole, 3 denotes a third dielectric material layer, and 9 denotes an absorption layer.

DETAILED DESCRIPTION OF THE EMBODIMENTS

Figure 1:
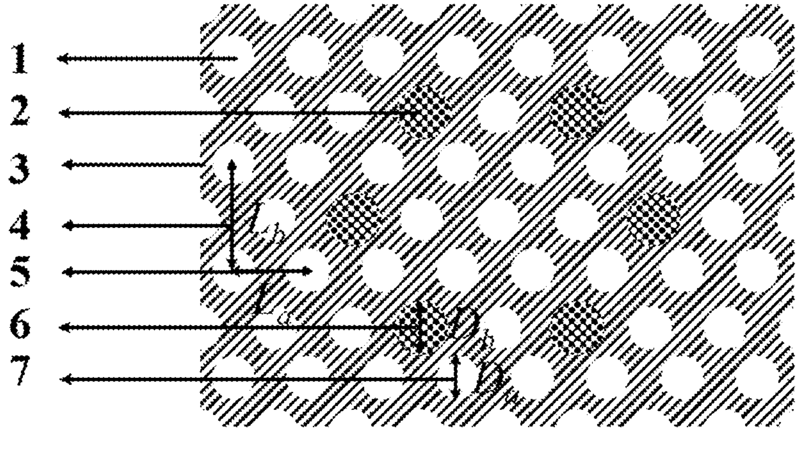
FIG. 1 is a longitudinal sectional view of a single-period focal plane detector prepared in accordance with an embodiment of the present disclosure, where the detector is enhanced by a topological photonic crystal with multi-coupled topological defects.

A short-wave infrared detector unit device provided in the present disclosure includes a substrate, and an epitaxial layer arranged on a surface of the substrate. The outermost layer of the epitaxial layer is an absorption layer 9. The short-wave infrared detector unit device further includes a photonic crystal structure layer with multi-coupled topological defects arranged on a surface of the absorption layer 9. The photonic crystal structure layer with multi-coupled topological defects is a third dielectric material layer 3 with a through-hole structure. The third dielectric material layer 3 has a refractive index of $n_3$. The through-hole structure includes first through holes 1 in periodic arrangement and second through holes 2 in periodic arrangement. Each of the first through holes 1 is filled with a first dielectric material, and the first dielectric material has a refractive index of $n_1$. Each of the second through holes 2 is filled with a second dielectric material, and the second dielectric material has a refractive index of $n_2$, where $n_1$ is less than $n_3$, and $n_2$ is less than $n_3$.

A periodic arrangement rule of the first through holes 1 is that: a center of any of the first through holes 1 is taken as a center of a first regular hexagon, where a side length of the first regular hexagon is La, and six vertexes of the first regular hexagon correspond to centers of the other six first through holes 1, respectively.

A periodic arrangement rule of the second through holes 2 is that: the third dielectric material layer 3 is divided into multiple rectangular regions with a center of one of the first through holes 1 as a center of one of the multiple rectangular regions, a length×width of each of the multiple rectangular regions is 8 La×6.92 La. The multiple rectangular regions do not overlap each other. The center of each of the multiple rectangular regions is taken as a center of a second regular hexagon, a side length of the second regular hexagon is 2 La, and six vertexes of the second regular hexagon correspond to centers of the second through holes 2.

In the present disclosure, all prepared raw materials/components are commercially available products well known to those skilled in the art, unless otherwise specified.

The short-wave infrared detector unit device provided in the present disclosure includes a substrate and an epitaxial layer arranged on a surface of the substrate, the outermost layer of the epitaxial layer is arranged as an absorption layer 9. The present disclosure has no special requirement on a material of the substrate, and can adopt the material well known to those skilled in the art. In accordance with the present disclosure, the absorption layer 9 is preferably made of InAs, and a thickness h of the absorption layer is preferably 0.1 μm. An infrared absorption wavelength of the short-wave infrared detector unit device is preferably 1.55 μm.

Figure 2:
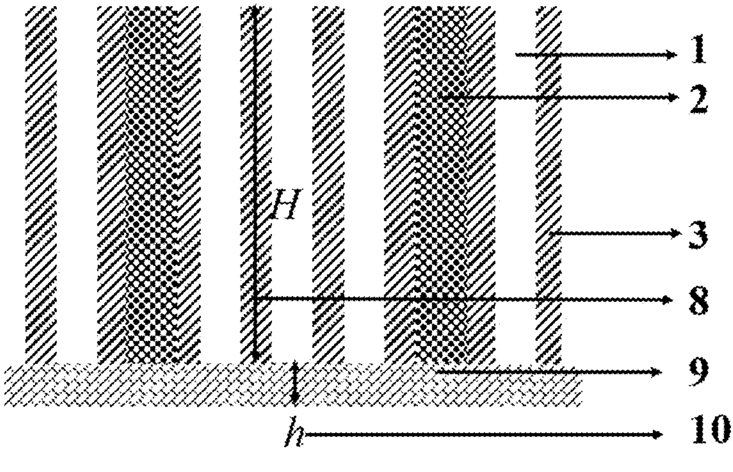
FIG. 2 is a cross sectional view of a single-period focal plane detector prepared in accordance with an embodiment of the present disclosure, where the detector is enhanced by a topological photonic crystal with multi-coupled topological defects.

As shown in FIG. 1 and FIG. 2, the short-wave infrared detector unit provided by the present disclosure further includes a photonic crystal structure layer with multi-coupled topological defects arranged on the surface of the absorption layer 9.

In accordance with the present disclosure, a thickness H of the photonic crystal structure layer with multi-coupled topological defects is preferably 100 nm.

In accordance with the present disclosure, La is preferably from 0.7 μm to 0.9 μm, particularly preferably 0.7 μm, 0.8 μm or 0.9 μm.

In accordance with the present disclosure, $n_3$ is preferably from 3 to 5, particularly preferably 3.47, 3.6, 4 or 4.4. $n_1$ is preferably from 1 to 2, particularly preferably 1.2, 1.46 or 1.6. $n_2$ is preferably from 1 to 2.29, more preferably 1.7, 1.8, 1.9 or 2.29.

In accordance with the present disclosure, Da is preferably from 0.2 μm to 0.8 μm, specifically preferably 0.2 μm, 0.4 μm, 0.5 μm, 0.6 μm, 0.7 μm or 0.8 μm. Db is preferably from 0.1 μm to 0.8 μm, specifically preferably 0.1 μm, 0.2 μm, 0.3 μm, 0.5 μm, 0.6 μm or 0.8 μm.

As one or more embodiments of the present disclosure, $n_1$ is 1.46, $n_2$ is 1.7, $n_3$ is 4.0, La is 0.8 μm, Da is 0.6 μm, and Db is 0.2 μm. The third dielectric material layer 3 with $n_3$ of 4.0 is preferably made of lead sulfide. The second dielectric material with $n_2$ of 1.7 is preferably aluminum oxide. And the first dielectric material with $n_1$ of 1.46 is preferably amorphous silicon dioxide.

As one or more embodiments of the present disclosure, $n_1$ is 1.46, $n_2$ is 1.7, $n_3$ is 4.0, La is 0.7 μm, Da is 0.5 μm, and Db is 0.2 μm.

As one or more embodiments of the present disclosure, $n_1$ is 1.46, $n_2$ is 2.29, $n_3$ is 3.47, La is 0.8 μm, Da is 0.6 μm, and Db is 0.4 μm. The third dielectric material layer 3 with $n_3$ of 3.47 is preferably made of a silicon material. The second dielectric material with $n_2$ of 2.29 is preferably a zinc sulfide material. And the first dielectric material with $n_1$ of 1.46 is preferably an amorphous silicon dioxide material.

In accordance with the present disclosure, a design of the multi-coupled topological defects is adopted to enhance the localization in a focal plane pixel of the infrared detector, and an epitaxial layer on the surface of the absorption layer material is etched to form a cellular-shaped photonic crystal array in orderly arrangement. A further micro-nano machining design is performed on a part of small hole arrays to form defect states in the photonic crystal array. Therefore, in the present disclosure, the localization of an incident light field by the photonic crystal structure is enhanced through the coupling between the topological defects and the interference of a leaky mode, enhancing an infrared signal of the focal plane pixel of the infrared detector.

The short-wave infrared detector unit device provided by the present disclosure can achieve the localization of the light field for the incident light with a wavelength of 1.55 μm.

A preparation method for the short-wave infrared detector unit device according to the above technical schemes is provided by the present disclosure, which includes the following steps.

A third dielectric material is deposited on a surface of an absorption layer to form a third dielectric material layer 3.

First through holes 1 are etched on the third dielectric material layer 3 according to a periodic arrangement rule of the first through holes 1, and each of the first through holes 1 is filled with a first dielectric material.

Second through holes 2 are etched on the third dielectric material layer 3 having the first through holes 1 according to an arrangement rule of the second through holes 2, and each of the second through holes 2 is filled with a second dielectric material, to obtain the short-wave infrared detector unit device.

In the present disclosure, the third dielectric material 3 is deposited on the surface of the absorption layer to form the third dielectric material layer 3. In the present disclosure, a preparation method for the third dielectric material layer 3 is preferably chemical deposition, and the present disclosure has no special requirements for the specific implementation process of the chemical deposition.

After the third dielectric material layer 3 is formed, the first through holes 1 are etched on the third dielectric material layer 3 according to the periodic arrangement rule of the first through holes 1, and each of the first through holes 1 is filled with the first dielectric material. The present disclosure has no special requirements for the specific implementation process of etching the first through holes 1. The present disclosure has no special requirements for the specific implementation process of the chemical deposition of the first dielectric material.

After the first dielectric material is chemically deposited, the second through holes 2 are etched on the third dielectric material layer 3 having the first through holes 1 according to the arrangement rule of the second through holes 2, and each of the second through holes 2 is filled with the second dielectric material, to obtain the short-wave infrared detector unit device. The present disclosure has no special requirements for the specific implementation process of the etching the second through hole 2. The present disclosure has no special requirements for the specific implementation process of the chemical deposition of the second dielectric material.

In order to further describe the present disclosure, the technical solutions provided by the present disclosure are described in detail below in conjunction with the embodiments, but cannot be understood as limiting the scope of protection of the present disclosure.

Embodiment 1

As shown in FIG. 1 and FIG. 2, a short-wave infrared detector unit device is provided, including a substrate and an epitaxial layer arranged on a surface of the substrate. An absorption layer 9 is arranged on the outermost layer of the epitaxial layer. The absorption layer 9 is made of an InAs material, and has a thickness h of 0.1 μm.

A third dielectric material having a refractive index of $n_3$ is chemically deposited on a surface of the absorbing layer 9 to form a third dielectric material layer 3. The third dielectric material layer 3 has a thickness of 100 nm. On the third dielectric material layer 3, a two-dimensional small hole array in periodic arrangement, namely first through holes 1, is formed by etching. As shown in FIG. 1, a diameter of each of the first through holes 1 is set to be Da, a transverse periodic length is set to be La, and each of the first through holes 1 is filled with a first dielectric material with a refractive index of $n_1$. An arrangement mode of the periodic first through hole array is in a cellular shape, thereby forming a periodic photonic crystal structure layer.

Then, a center of one of the first through holes 1 is taken as a center of a rectangle with a size of 8 La×6.92 La. Six topological defect states (i.e., second through holes 2) are designed and etched in a central region of each rectangular large photonic crystal cell, and the six second through holes 2 are arranged on six vertexes of a regular hexagon with a side length of 2 La. The diameter of each of the second through holes 2 is Db. Then, each of the second through holes 2 is filled with a second dielectric material, and the second dielectric material has a refractive index of $n_2$. An array structure formed by the second dielectric material filled in the second through holes 2 causes defects in the periodic photonic crystal, so as to obtain the short-wave infrared detector unit device arranged with the photonic crystal structure layer with multi-coupled topological defects on the surface.

In this embodiment, FIG. 1 is a longitudinal sectional view of a single-period focal plane detector prepared in accordance with this embodiment, where the detector is enhanced by a topological photonic crystal with multi-coupled topological defects, in which 1 denotes the first through holes (forming a cellular-shaped photonic crystal array), and the refractive index of the first dielectric material filled in the first through holes is $n_1$; 2 denotes the second through holes (forming the topological defects in the photonic crystal structure), and the refractive index of the second dielectric material filled in the second through holes is $n_2$; 3 denotes the third dielectric material layer 3 (an unetched region), and the refractive index of the third dielectric material is $n_3$; 4 denotes a vertical spacing Lb of the photonic crystal array; 5 denotes a horizontal spacing La of the photonic crystal array, and the relationship between Lb and La satisfies: Lb=1.73×La; 6 denotes a diameter Db of the second through hole (point defect structure); and 7 denotes a diameter Da of the first through hole (forming a photonic junction structure).

FIG. 2 is a cross sectional view of a single-period focal plane detector prepared in accordance with this embodiment, where the detector is enhanced by a topological photonic crystal with multi-coupled topological defects, where 8 denotes a thickness H (100 nm) of the photonic crystal structure, 9 denotes the absorption layer made of InAs, and 10 denotes a thickness h of the absorption layer.

Figures 3, 4A:
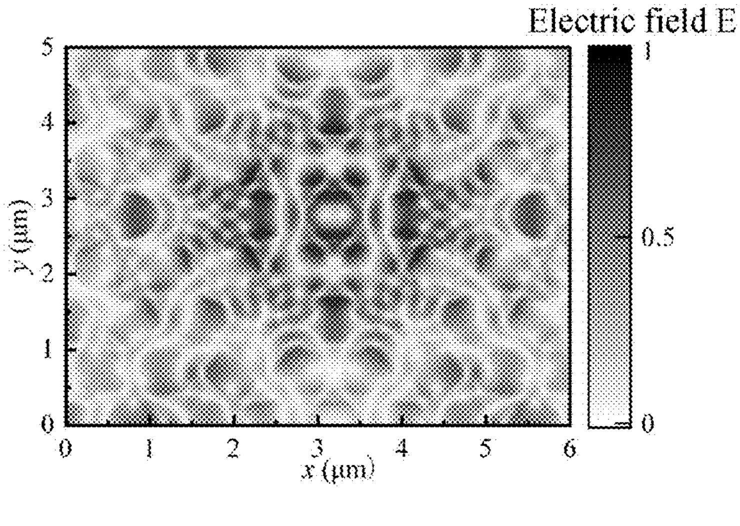
FIG. 3 is a distribution diagram of a modulus of eigenmode electric field excited by a photonic crystal structure when parameters of the photonic crystal prepared in accordance with Embodiment I of the present disclosure are that $n_1$=1.46, $n_2$=1.7, $n_3$=4.0, La=0.8 μm, Da=0.6 μm and Db=0.2 μm.
FIGS. 4A-4C illustrate the coupling strength of eigenmodes of the photonic crystal structure at different geometric parameters (La, Da and Db).

FIG. 3 is a distribution diagram of a modulus of electric field for an eigenmode excited by the photonic crystal structure when parameters of the photonic crystal prepared in accordance with this embodiment are that $n_1$=1.46 (amorphous silicon dioxide material), $n_2$=1.7 (aluminum oxide material), $n_3$=4.0 (lead sulfide material), La=0.8 μm, Da=0.6 μm and Db=0.2 μm.

As can be seen from FIG. 3, when the parameters are that $n_1$=1.46, $n_2$=1.7, $n_3$=4.0, La=0.8 μm, Da=0.6 μm, and Db=0.2 μm, the distribution of the excited eigenmode electric field (the size of the electric field is normalized) shows that the electric fields are mainly localized on edges of a defect-state structure and the central region enclosed by six defect states, indicating that the multi-defect coupled photonic crystal structure designed by the present disclosure can achieve the enhancement of spatial localization of the electromagnetic field, thereby enhancing a focal plane array device with small pixel area.

In the following embodiments 2 to 4, the refractive index parameters of filling materials in the multi-defect coupled photonic crystal structure and geometric parameters (La, Da, Db) of the first through holes and the second through holes are changed in accordance with the present disclosure, to analyze the localization ability of the photonic crystal designed by the present disclosure to the energy of the electromagnetic field. In order to quantify the localization ability, according to the characteristics that the electric field strength of the localized mode decreases rapidly with the increase of a distance from the center, a formula for calculating the coupling strength is defined, as shown in Equation 1:

$$\text{Coupling strength} = \frac{E_{max}\int ds}{\int Eds} \quad \text{Formula 1}$$

In Formula 1, $E_{max}$ is the maximum value of a localized mode electric field excited by the photonic crystal, and ds denotes an area integral of the surface of the photonic crystal. The coupling strength is defined as a ratio of the maximum value of a coupled mode electric field in an interface between the photonic crystal and the absorption layer material to an average value of modulus of electric field in the interface.

The coupling strength defined by the present disclosure is used to quantify the localization degree of the localized field of the photonic crystal structure, and the larger the value, the higher the localization degree.

Embodiment 2

The preparation method in this embodiment is basically the same as that of embodiment 1. In this embodiment, under the conditions that $n_1$=1.46, $n_2$=1.7, $n_3$=4.0 are fixed, and the geometric parameters (La, Da, Db) are changed, the influence of the photonic crystal structure on the electric field localization caused by the introduction of the defect states is analyzed, and then the geometric parameters (La, Da, Db) are determined to meet the requirements of achieving the localization of the light field by the photonic crystal structure with multi-coupled topological defects.

Figure 4B:
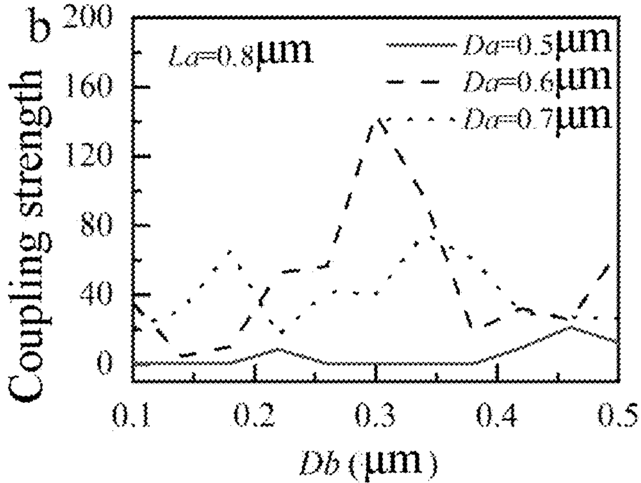
Figure 4C:
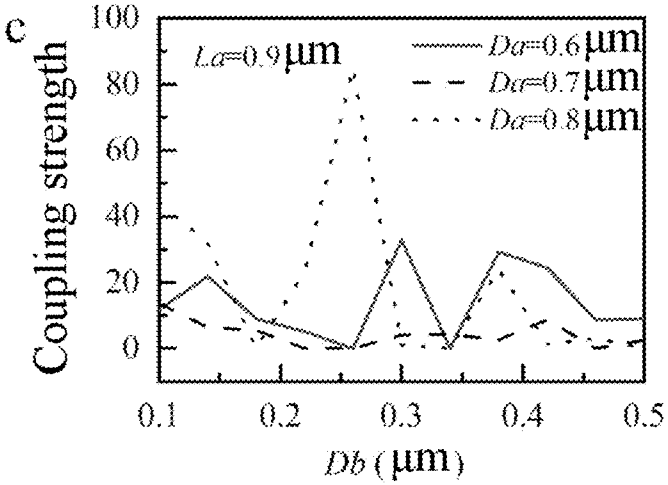

FIGS. 4A-4C illustrate the coupling strength of eigenmodes for the photonic crystal structure calculated according to Formula 1 at different geometric parameters. FIG. 4A shows the change of the coupling strength with the change of Db when La=0.7 μm, Da is 0.4 μm, 0.5 μm and 0.6 μm, respectively. FIG. 4B shows the change of the coupling strength with the change of Db when La=0.8 μm, Da is 0.5 μm, 0.6 μm and 0.7 μm, respectively. FIG. 4C shows the change of coupling strength with the change of Db when La=0.9 μm, Da is 0.6 μm, 0.7 μm and 0.8 μm, respectively. In FIGS. 4A-4C, other parameters are that $n_1$=1.46, $n_2$=1.7, and $n_3$=4.0.

As shown in FIGS. 4A-4C, in this embodiment, the coupling strength is changed with the change of the defect state diameter Db under different diameters Da when the transverse spacing La of the photonic crystal is 0.7 μm, 0.8 μm and 0.9 μm, respectively. It can be seen that in the calculation results that of La of 0.7 μm and 0.8 μm, the change degree of the coupling strength with Db and Da is relatively gentle compared with that of La of 0.9 μm. Therefore, in this embodiment, a group of values with La of 0.7 μm, Da of 0.5 μm and Db of 0.2 μm are selected, which can ensure that the experimental error has little influence on the theoretical calculation results in actual processing.

Embodiment 3

The preparation method in this embodiment is basically the same as that of embodiment 1. In this embodiment, in a condition that La=0.8 μm, Da=0.6 μm and Db=0.3 μm, and the refractive indexes ($n_1$, $n_2$, $n_3$) of three types of filling materials are changed, the coupling strength of eigenmodes for the photonic crystal structure at different refractive indexes is analyzed, and then the refractive indexes ($n_1$, $n_2$, $n_3$) of the three types of filling materials are determined, so as to meet the requirements of achieving the localization of the light field by the photonic crystal structure with multi-coupled topological defects.

Figure 5A:
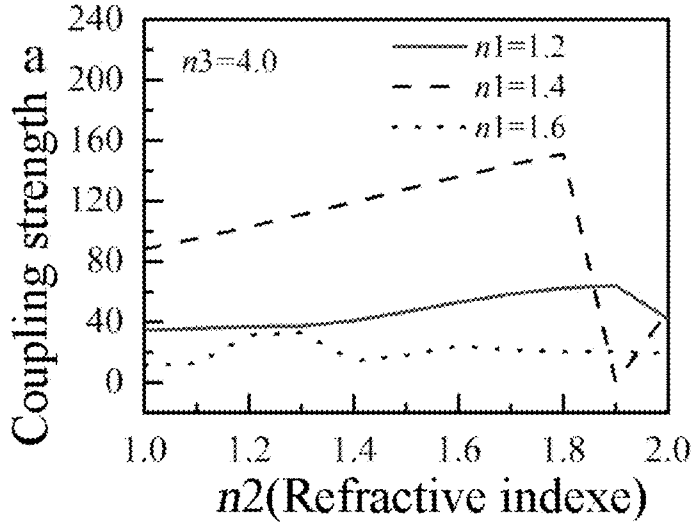
FIGS. 5A-5C illustrate the coupling strength of eigenmodes of the photonic crystal structure at different refractive indexes.
Figure 5B:
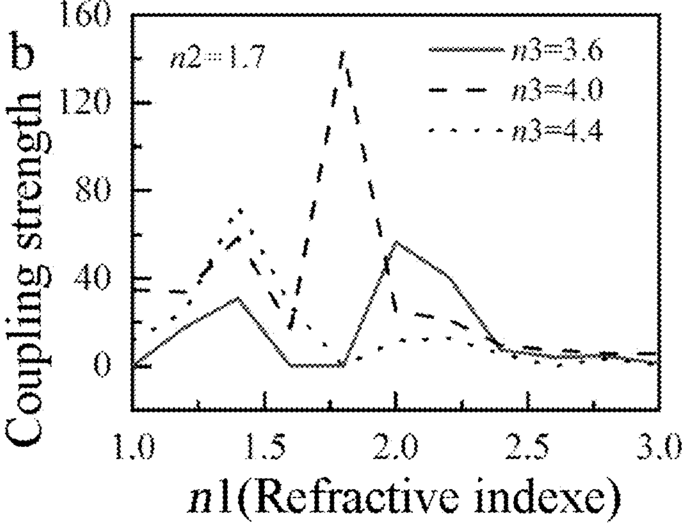
Figure 5C:
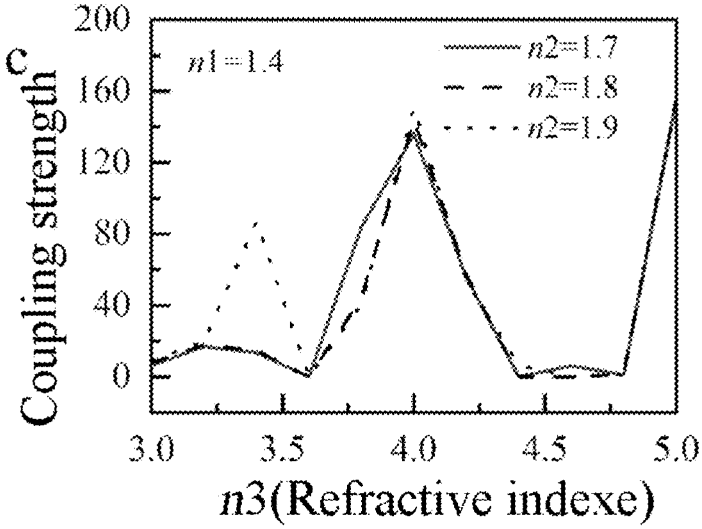

FIGS. 5A-5C illustrate the coupling strength of eigenmodes for the photonic crystal structure calculated according to Formula 1 at different refractive indexes. FIG. 5A shows the change of the coupling strength with the change of $n_2$, when $n_3$=4.0, and $n_1$ is 1.2, 1.46, and 1.6, respectively. FIG. 5B shows the change of the coupling strength with the change of $n_1$, when $n_2$=1.7, and $n_3$ is 3.6, 4.0, and 4.4, respectively. FIG. 5C shows the change of the coupling strength with the change of $n_3$, when $n_1$=1.46, and $n_2$ is 1.7, 1.8, and 1.9, respectively (Note: $n_1$=1.4 as shown in FIGS. 5A-5C denotes that $n_1$=1.46 in this embodiment).

FIGS. 5A-5C show the change of the coupling strength when two of the three refractive index parameters $n_1$, $n_2$ and $n_3$ are fixed, and the other one is the changed, in the photonic crystal structure with multi-coupled topological defects. By comparison, it can be found that the coupling strength is the least sensitive to the change of the refractive index $n_2$ of the filling medium in the defect state within a certain range, followed by the refractive index $n_1$ of the filling medium in the photonic crystal, and is more sensitive to the refractive index of the material in the unetched region.

Embodiment 4

The preparation method of this embodiment is basically the same as that of embodiment 1. In this embodiment, in a condition that $n_3$=3.47 (silicon material), $n_2$=2.29 (zinc sulfide material) and $n_1$=1.46 (amorphous silicon dioxide material), and La=0.8 μm, the changes of the coupling strength with the changes of Da and Db, respectively are shown.

Figure 6A:
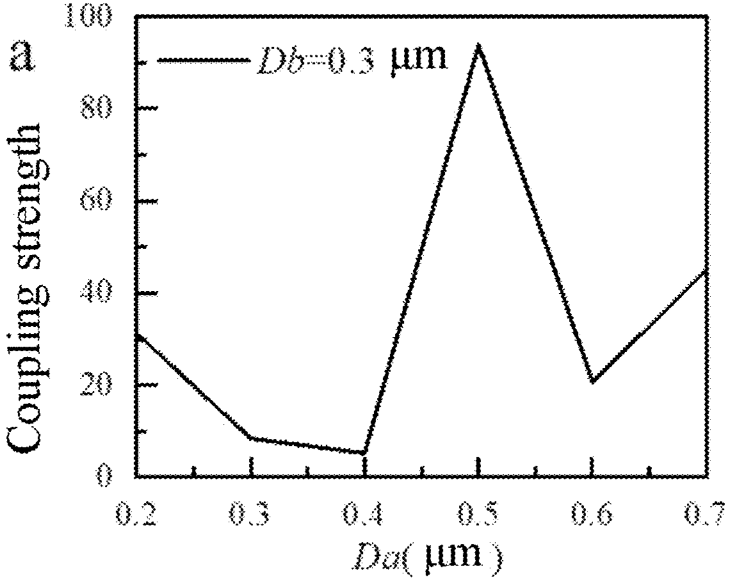
FIGS. 6A-6B illustrate the changes of the coupling strength with the change of Da and Db when $n_3$=3.47 (silicon material), $n_2$=2.29 (zinc sulfide material), $n_1$=1.46 (silicon dioxide material) and La=0.8 μm.
Figure 6B:
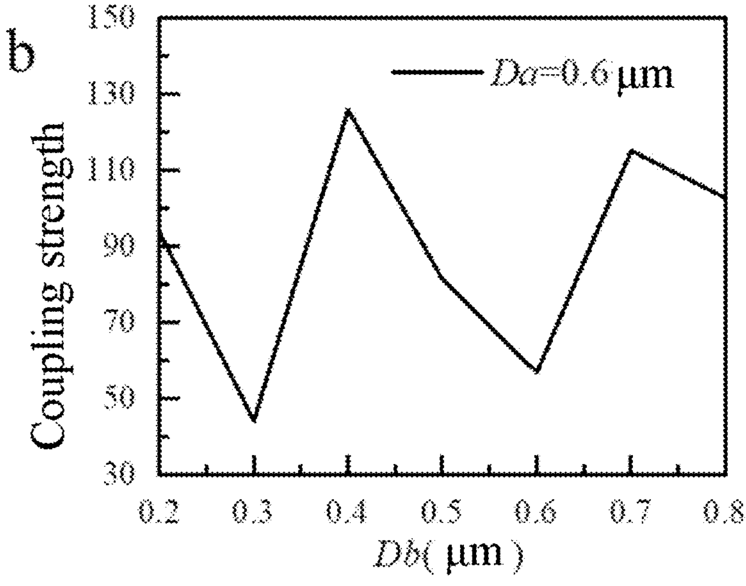

In FIGS. 6A-6B, when the materials with refractive indexes of $n_1$, $n_2$ and $n_3$ are zinc sulfide, silicon oxide and silicon materials, respectively, and the spacing La between the photonic crystal units is 0.8 μm, the change of the coupling strength is illustrated when the diameter of the photonic crystal unit and the defect diameter are changed, respectively. And when Da=0.6 μm and Db=0.4 μm, stronger coupling strength can be obtained.

Although the present disclosure is described in detail with reference to the above embodiments, the described embodiments are merely a part rather than all of the embodiments of the present disclosure. All other embodiments can also be obtained based on the embodiments of the present disclosure without creative efforts, all of which shall fall within the scope of protection of the present disclosure.

What is claimed is:

1. A short-wave infrared detector unit device, comprising a substrate, and an epitaxial layer arranged on a surface of the substrate, wherein an outermost layer of the epitaxial layer is an absorption layer (9); wherein the short-wave infrared detector unit device further comprises a photonic crystal structure layer arranged on a surface of the absorption layer (9), the photonic crystal structure layer is a third dielectric material layer (3) with a through-hole structure, the third dielectric material layer (3) has a refractive index of $n_3$; the through-hole structure comprises first through holes (1) in periodic arrangement and second through holes (2) in periodic arrangement; each of the first through holes (1) is filled with a first dielectric material, the first dielectric material has a refractive index of $n_1$; each of the second through holes (2) is filled with a second dielectric material, and the second dielectric material has a refractive index of $n_2$, wherein $n_1$ is less than $n_3$, and $n_2$ is less than $n_3$;

wherein a periodic arrangement rule of the first through holes (1) is that: a center of any of the first through holes (1) is taken as a center of a first regular hexagon, a side length of the first regular hexagon is La, and six vertexes of the first regular hexagon correspond to centers of other six first through holes (1), respectively; and a periodic arrangement rule of the second through holes (2) is that: the third dielectric material layer (3) is divided into a plurality of rectangular regions with a center of one of the first through holes (1) as a center of one of the plurality of rectangular regions, a length× width of each of the plurality of rectangular regions is 8 La×6.92 La, the plurality of rectangular regions do not overlap each other, the center of each of the plurality of rectangular regions is taken as a center of a second regular hexagon, a side length of the second regular hexagon is 2 La, and six vertexes of the second regular hexagon correspond to centers of the second through holes (2);

wherein $n_1$, $n_2$, $n_3$, La, a diameter Da of each of the first through holes (1), and a diameter Db of each of the second through holes (2) are set as follows:

a) $n_1$ is 1.46, $n_2$ is 1.7, $n_3$ is 4.0, La is 0.8 μm, Da is 0.6 μm, and Db is 0.2 μm; or b) $n_3$ is 4.0, $n_2$ is 1.7, $n_1$ is 1.46, La is 0.7 μm, Da is 0.5 μm, and Db is 0.2 μm; or c) $n_3$ is 3.47, $n_2$ is 2.29, $n_1$ is 1.46, La is 0.8 μm, Da is 0.6 μm, and Db is 0.4 μm, and wherein the third dielectric material layer (3) is made of a silicon material, the second dielectric material is a zinc sulfide material, and the first dielectric material is an amorphous silicon dioxide material.

2. The short-wave infrared detector unit device according to claim 1, wherein the absorption layer (9) is made of InAs, and a thickness h of the absorption layer is 0.1 μm; an infrared absorption wavelength of the short-wave infrared detector unit device is 1.55 μm.

3. A preparation method for the short-wave infrared detector unit device according to claim 2, comprising:

depositing a third dielectric material on a surface of an absorption layer to form a third dielectric material layer (3);

etching first through holes (1) on the third dielectric material layer (3) according to a periodic arrangement rule of the first through holes (1), and filling each of the first through holes (1) with a first dielectric material;

etching second through holes (2) on the third dielectric material layer (3) having the first through holes (1) according to an arrangement rule of the second through holes (2), and filling each of the second through holes (2) with a second dielectric material, to obtain the short-wave infrared detector unit device.

4. The short-wave infrared detector unit device according to claim 1, wherein a thickness H of the photonic crystal structure layer is 100 nm.

5. A preparation method for the short-wave infrared detector unit device according to claim 1, comprising:

depositing a third dielectric material on a surface of an absorption layer to form a third dielectric material layer (3);

etching first through holes (1) on the third dielectric material layer (3) according to a periodic arrangement rule of the first through holes (1), and filling each of the first through holes (1) with a first dielectric material;

etching second through holes (2) on the third dielectric material layer (3) having the first through holes (1) according to an arrangement rule of the second through holes (2), and filling each of the second through holes (2) with a second dielectric material, to obtain the short-wave infrared detector unit device.

6. A preparation method for the short-wave infrared detector unit device according to claim 3, comprising:

depositing a third dielectric material on a surface of an absorption layer to form a third dielectric material layer (3);

etching first through holes (1) on the third dielectric material layer (3) according to a periodic arrangement rule of the first through holes (1), and filling each of the first through holes (1) with a first dielectric material;

etching second through holes (2) on the third dielectric material layer (3) having the first through holes (1) according to an arrangement rule of the second through holes (2), and filling each of the second through holes (2) with a second dielectric material, to obtain the short-wave infrared detector unit device.

* * * * *